(12) United States Patent
Sugahara et al.

(10) Patent No.: US 8,949,690 B2
(45) Date of Patent: Feb. 3, 2015

(54) MEMORY CONTROLLER

(75) Inventors: Takahiko Sugahara, Osaka (JP); Eri Fukushita, Osaka (JP)

(73) Assignee: MegaChips Corporation, Osaka-shi (JP)

( * ) Notice: Subject to any disclaimer, the term of this patent is extended or adjusted under 35 U.S.C. 154(b) by 357 days.

(21) Appl. No.: 13/423,566

(22) Filed: Mar. 19, 2012

(65) Prior Publication Data

US 2012/0317463 A1    Dec. 13, 2012

(30) Foreign Application Priority Data

Jun. 13, 2011    (JP) .................................. 2011-131246

(51) Int. Cl.
  *G11C 29/00*      (2006.01)
  *G06F 11/10*      (2006.01)
  *H03M 13/05*      (2006.01)
  *H03M 13/37*      (2006.01)

(52) U.S. Cl.
  CPC ........... *G06F 11/1048* (2013.01); *H03M 13/05* (2013.01); *H03M 13/3715* (2013.01); *H03M 13/3738* (2013.01)
  USPC ........................................................ 714/764

(58) Field of Classification Search
  CPC ............................ H03M 13/35; H03M 13/356
  See application file for complete search history.

(56) References Cited

U.S. PATENT DOCUMENTS

| | | | |
|---|---|---|---|
| 7,409,623 B2 * | 8/2008 | Baker et al. | 714/763 |
| 7,877,668 B2 | 1/2011 | Sugahara | |
| 7,894,289 B2 * | 2/2011 | Pawlowski | 365/222 |
| 8,006,166 B2 * | 8/2011 | Roohparvar et al. | 714/768 |
| 8,122,323 B2 | 2/2012 | Leung et al. | |
| 8,375,273 B2 * | 2/2013 | Hara | 714/763 |
| 8,381,076 B2 * | 2/2013 | Radke | 714/769 |
| 8,572,466 B2 * | 10/2013 | Bueb et al. | 714/774 |
| 2008/0086677 A1 * | 4/2008 | Yang et al. | 714/763 |
| 2008/0183982 A1 | 7/2008 | Sugahara et al. | |
| 2008/0222490 A1 | 9/2008 | Leung et al. | |
| 2008/0282106 A1 * | 11/2008 | Shalvi et al. | 714/6 |
| 2009/0044076 A1 | 2/2009 | Sugahara | |
| 2009/0144598 A1 * | 6/2009 | Yoon et al. | 714/752 |

(Continued)

FOREIGN PATENT DOCUMENTS

| | | |
|---|---|---|
| JP | 2008-192054 | 8/2008 |
| JP | 2009-141453 | 6/2009 |

(Continued)

OTHER PUBLICATIONS

Te-Hsuan Chen; Yu-Ying Hsiao; Yu-Tsao Hsing; Cheng-Wen Wu, "An Adaptive-Rate Error Correction Scheme for NAND Flash Memory," VLSI Test Symposium, 2009. VTS '09. 27th IEEE , vol., no., pp. 53,58, May 3-7, 2009.*

*Primary Examiner* — Steve Nguyen
(74) *Attorney, Agent, or Firm* — Oblon, Spivak, McClelland, Maier & Neustadt, L.L.P.

(57) ABSTRACT

An ECC circuit can operate in a plurality of error correction modes with different correcting capabilities for data stored in a memory. The ECC circuit calculates a syndrome with respect to information data in accordance with an error correction mode set by a control part and adds a syndrome of a fixed length in which dummy bits are added to the calculated syndrome, to the information data. When code data is read out, the ECC circuit performs a correction process on the code data by using the syndrome included in the code data.

11 Claims, 10 Drawing Sheets

(56) References Cited

U.S. PATENT DOCUMENTS

2010/0100763 A1* 4/2010 Chen .............................. 714/6
2010/0281341 A1* 11/2010 Wu et al. ...................... 714/763

FOREIGN PATENT DOCUMENTS

| JP | 2010-518523 | 5/2010 |
| WO | WO 2008/109586 A1 | 9/2008 |

* cited by examiner

MEMORY CONTROLLER

BACKGROUND OF THE INVENTION

1. Field of the Invention

The present invention relates to an error correction technique for data stored in a semiconductor memory.

2. Description of the Background Art

As recording media for a variety of data, nonvolatile semiconductor memories such as NAND flash memories and the like are widely used. With miniaturization of a process technology or the like, high integration of nonvolatile semiconductor memories is more and more progressing.

When data is written into a nonvolatile semiconductor memory, some errors occur in the written data in some cases. This is a so-called program disturb. Further, when data are repeatedly read out from a nonvolatile semiconductor memory, some errors also sometimes occur in stored data. This is a so-called read disturb. Therefore, for using nonvolatile semiconductor memories including NAND flash memories, it is indispensable to equip the memories with some error correction function.

As circuits for implementing the error correction function, ECC (Error Check and Correction) circuits are generally used. The ECC circuit calculates a syndrome from information data to be stored in a memory array. In the memory array, stored is code data in which the syndrome is added to the information data. The ECC circuit performs an error correction process on the code data read out from the memory array by using the syndrome.

In general, the level (high or low) of error correcting capability of the ECC circuit is in proportion to a syndrome length. As the error correcting capability increases, the syndrome length becomes larger and the code rate decreases. The decrease in the code rate results in a decrease in storage efficiency of the information data in a memory. Therefore, for determination of error correcting capability, it is necessary to consider both the error rate and the storage efficiency of the information data. The code rate refers to a ratio of a data length of the information data to a data length of the code data and has a close relation with the error correcting capability.

In nonvolatile semiconductor memories, time degradation of cells due to the miniaturization of the process technology is becoming pronounced. When a nonvolatile semiconductor memory continues to be used, the error rate increases as the cells are degraded. There is a possibility that the error correcting capability set in an initial state for use may become insufficient with time. Alternatively, when the error correcting capability is set higher from the beginning of use on the assumption that the cells become degraded with time, the storage efficiency of the information data unnecessarily decreases due to the decrease in the code rate.

National Publication of Translation No. 2010-518523 discloses a technique for changing the code rate and varying the error correcting capability in accordance with a change in the bit error rate.

In National Publication of Translation No. 2010-518523, the time degradation of a memory is dealt with by changing the code rate in accordance with a change in the bit error rate. Since the code rate is changed, however, the data management and operation becomes complicated. In other words, since the data length of the code data is changed, the data structure needs to be restructured or the like and the process becomes complicated.

SUMMARY OF THE INVENTION

The present invention is intended for a memory controller for controlling access to a semiconductor memory. According to an aspect of the present invention, the memory controller comprises an error correction part capable of performing an error correction process in a plurality of error correction modes with different correcting capabilities for data stored in the semiconductor memory, a control part for setting an error correction mode to be applied to information data when the information data is stored into the semiconductor memory, and an interface which reads and writes the information data from/into the semiconductor memory, and in the memory controller of the present invention, the error correction part includes a syndrome calculation part for calculating a syndrome with respect to the information data in accordance with the error correction mode set by the control part, and a code data generation part for generating code data with a fixed code length which is set commonly to the plurality of error correction modes, which includes the information data, the syndrome which is calculated, and dummy data to be added thereto as needed, the interface writes the code data into the semiconductor memory, and the error correction part further includes a correction processing part for performing a correction process on the code data by using the syndrome included in the code data when the interface reads out the code data.

By the present invention, it becomes possible to use a plurality of error correction modes without complicated data management and operation.

According to another aspect of the present invention, the memory controller comprises a control part for setting an error correction mode for an error correction process to be applied to data stored in the semiconductor memory, a first interface for reading first data out from the semiconductor memory when the first interface receives a read request for the first data stored in the semiconductor memory from an external device, an error correction part for performing the error correction process on the first data read out by the first interface by using the error correction mode set by the control part, a correction data buffer for storing therein the first data corrected by the error correction part, a determination part for determining if the error correction process performed by the error correction part is valid by analyzing the first data corrected by the error correction part, and a second interface giving the first data which is already corrected and stored in the correction data buffer to the external device when the determination part determines that the error correction process performed by the error correction part is valid, and in the memory controller of the present invention, the control part changes the error correction mode to an error correction mode with a correcting capability higher than that of the error correction mode which is currently set when the determination part determines that the error correction process performed by the error correction part is invalid, the error correction part performs the error correction process on the first data again by using the error correction mode after being changed, the correction data buffer stores therein the first data corrected in the error correction mode after being changed, and the determination part determines if the error correction process performed by the error correction part is valid by analyzing the first data corrected in the error correction mode after being changed.

By the present invention, it becomes possible to perform an error correction process on each data without holding information on an error correction mode which is applied to the data.

Therefore, it is an object of the present invention to increase the reliability of a semiconductor memory whose error rate varies with time, without complicated data management and operation.

These and other objects, features, aspects and advantages of the present invention will become more apparent from the following detailed description of the present invention when taken in conjunction with the accompanying drawings.

DESCRIPTION OF THE PREFERRED EMBODIMENTS

The First Preferred Embodiment

Hereinafter, with reference to figures, the first preferred embodiment of the present invention will be discussed.

{1. Overall Structure}

Figure 1:
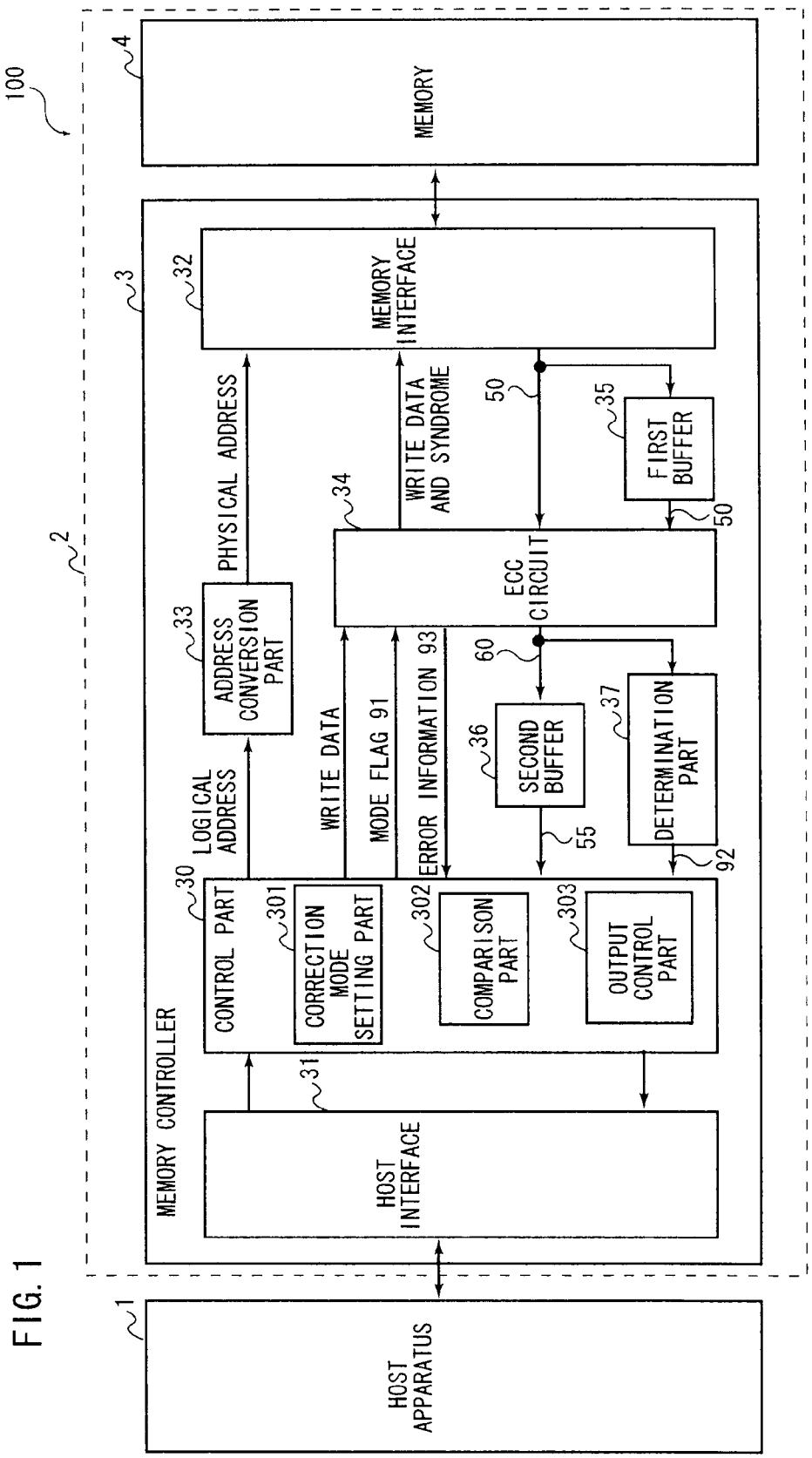
FIG. 1 is a functional block diagram showing a constitution of an information processing system in accordance with preferred embodiments of the present invention.

FIG. 1 is a functional block diagram showing a constitution of an information processing system 100 in accordance with the first preferred embodiment. The information processing system 100 comprises a host apparatus 1 and a memory system 2.

The host apparatus 1 is, for example, a PC (Personal Computer), a portable terminal, or the like. The memory system 2 is a USB (Universal Serial Bus) memory, a memory card, or the like, which is detachable/attachable from/to the host apparatus 1.

The memory system 2 comprises a memory controller 3 and a memory 4. The memory controller 3 writes/reads data into/from the memory 4 in response to a request of the host apparatus 1. In other words, the memory controller 3 controls access to the memory 4.

The memory 4 is a rewritable nonvolatile semiconductor memory. In the present preferred embodiment, the memory 4 is a NAND flash memory.

{2. Constitution of Memory Controller 3}

Hereinafter, discussion will be made on a constitution of the memory controller 3. The memory controller 3 comprises a control part 30, a host interface 31, a memory interface 32, an address conversion part 33, an ECC (Error Check and Correction) circuit 34, a first buffer 35, a second buffer 36, and a determination part 37.

The control part 30 controls all the functional parts of the memory controller 3. The control part 30 comprises a correction mode setting part 301, a comparison part 302, and an output control part 303. The correction mode setting part 301 sets an operation mode of the ECC circuit 34. The comparison part 302 determines if an error correction process performed by the ECC circuit 34 is valid. The output control part 303 controls an output of data read out from the memory 4.

The host interface 31 is an interface for performing input/output of commands and data between the host apparatus 1 and the memory controller 3. In other words, the host interface 31 inputs a read command, a write command, and the like from the host apparatus 1. The host interface 31 outputs data or the like which are read out from the memory 4 to the host apparatus 1.

The memory interface 32 is an interface for performing input/output of commands and data between the memory controller 3 and the memory 4. In other words, the memory interface 32 outputs commands, data to be written, and the like to the memory 4. The memory interface 32 outputs data read out from the memory 4, and the like to the memory controller 3.

The address conversion part 33 converts a logical address which is inputted with a command from the host apparatus 1 into a physical address of the memory 4. The address conversion part 33 holds a translation table indicating a correspondence between logical addresses and physical addresses and converts addresses by using the translation table.

The ECC circuit 34 is a circuit for detecting an error in the data read out from the memory 4 and correcting the detected error. The ECC circuit 34 of the present preferred embodiment can operate in a plurality of error correction modes with different correcting capabilities. In the present preferred embodiment, the ECC circuit 34 can operate in three levels of error correction modes, i.e., the first to third error correction modes. The first error correction mode has the lowest correcting capability. The second error correction mode has a correcting capability higher than that of the first error correction mode. The third error correction mode has a correcting capability higher than that of the second error correction mode. In the first preferred embodiment, an individual error correction mode can be set for each page of the memory 4. Though three levels of error correction modes are used in the first preferred embodiment, four levels or more of error correction modes may be used.

The first buffer 35 temporally stores therein the data read out from the memory 4. The second buffer 36 stores therein data whose error is corrected by the ECC circuit 34. The determination part 37 determines if the error correction process performed by the ECC circuit 34 is valid. Specifically, the determination part 37 determines if the error correction process performed by the ECC circuit 34 is valid by using a hash function.

{3. Structure of Memory 4}

Figure 2:
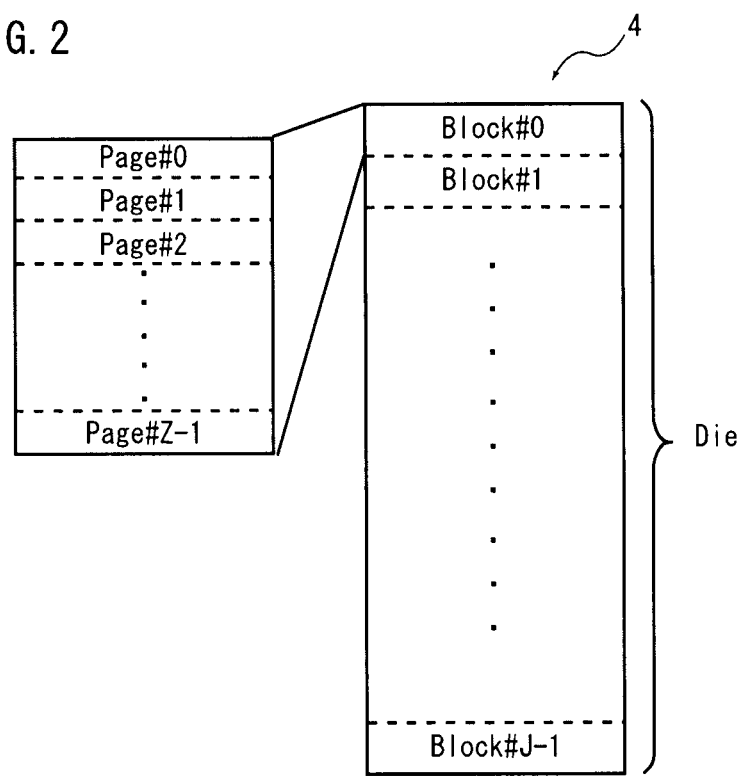
FIG. 2 is a view showing a structure of a memory 4.

FIG. 2 is a view showing a structure of the memory 4. Specifically, the memory 4 is formed of a die. The die includes a plurality of blocks. In the exemplary case of FIG. 2, the die includes J blocks. One block includes a plurality of pages. In the exemplary case of FIG. 2, one block includes Z pages.

The page is a unit of reading data and a unit of writing data from/into the memory 4. The memory controller 3 can read data recorded in the memory 4 on a page basis and write data which is instructed to be written, into the memory 4 on a page basis. The block is a unit of deleting data from the memory 4.

{4. Overview of Operation of Memory Controller 3}

Hereinafter, discussion will be made on an overview of an operation of the memory controller 3. When a read command is inputted from the host apparatus 1, the memory controller 3 performs a read operation of data from the memory 4. The memory controller 3 specifies a page to be read out, on the basis of an address specified by the read command.

The data read out from the memory 4 is given to the ECC circuit 34 and the first buffer 35. The ECC circuit 34 performs an error correction process on the read data in accordance with an error correction mode set by the correction mode setting part 301.

The determination part 37 determines if the error correction process performed by the ECC circuit 34 is valid. When the error correction process is determined to be valid, the output control part 303 outputs data stored in the second buffer 36 to the host apparatus 1.

When the error correction process is determined to be invalid, the correction mode setting part 301 changes the error correction mode to an error correction mode with a correcting capability higher than that of the current mode. The ECC circuit 34 performs an error correction process again on the read data stored in the first buffer 35 in accordance with the changed error correction mode.

After the read data is corrected in the changed error correction mode, the corrected data is stored into the second buffer 36 again. Further, the corrected data is outputted to the determination part 37, and the determination part 37 determines if the error correction process performed by the ECC circuit 34 is valid. When the error correction process is determined to be valid, the output control part 303 outputs the data stored in the second buffer 36 to the host apparatus 1. When the error correction process is determined to be invalid, the memory controller 3 further increases the correcting capability of the error correction mode. Thus, the memory controller 3 can operate in a plurality of error correction modes with different correcting capabilities. The memory controller 3 repeatedly performs the error correction process with the correcting capability made higher until the error correction process is confirmed to be valid.

{5. Data Structure of Code Data 50}

Figure 3:
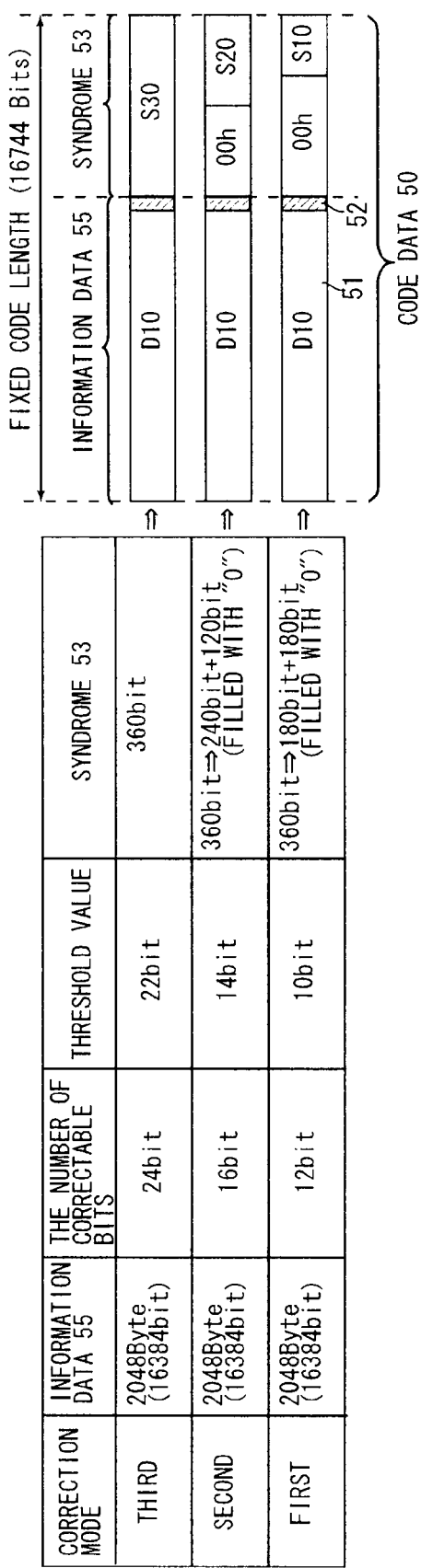
FIG. 3 is a view showing respective structures of code data 50 which are set in accordance with error correction modes in accordance with a first preferred embodiment.

As discussed above, in the first preferred embodiment, the ECC circuit 34 can operate in a plurality of error correction modes with different correcting capabilities. FIG. 3 is a view showing respective data structures of code data 50 in the first to third error correction modes in accordance with the first preferred embodiment.

In the first error correction mode, it is possible to perform error correction of 12 bits on information data 55 of 2048 bytes. In the first error correction mode, a syndrome (S10) of 180 bits is used with respect to the information data 55 of 2048 bytes. By adding dummy data of 180 bits of all "0" to the syndrome (S10) of 180 bits, however, a syndrome 53 of 360 bits as a whole is stored into the memory 4.

In the lowest row of FIG. 3, shown is a data structure of the code data 50 in which the dummy data of 180 bits filled with "0" and the syndrome (S10) of 180 bits are added to the information data 55 (D10) of 2048 bytes. The information data 55 (D10) includes substantial data 51 and a hash value 52. In FIG. 3, the hash value 52 is hatched.

In the second error correction mode, it is possible to perform error correction of 16 bits on information data 55 of 2048 bytes. In the second error correction mode, a syndrome (S20) of 240 bits is used with respect to the information data 55 of 2048 bytes. By adding dummy data of 120 bits of all "0" to the syndrome (S20) of 240 bits, however, the syndrome 53 of 360 bits as a whole is stored into the memory 4.

In the middle row of FIG. 3, shown is a data structure of the code data 50 in which the dummy data of 120 bits filled with "0" and the syndrome (S20) of 240 bits are added to the information data 55 (D10) of 2048 bytes.

In the third error correction mode, it is possible to perform error correction of 24 bits on information data 55 of 2048 bytes. In the third error correction mode, a syndrome (S30) of 360 bits is used with respect to the information data 55 of 2048 bytes. The syndrome (S30) of 360 bits itself is stored into the memory 4 as the syndrome 53.

In the uppermost row of FIG. 3, shown is a data structure of the code data 50 in which the syndrome (S30) of 360 bits is added to the information data 55 (D10) of 2048 bytes.

Thus, in the first to third error correction modes, the bit lengths of the needed syndromes (S10) to (S30) are different. In the first preferred embodiment, however, by adding the dummy data thereto, the syndromes 53 of a common fixed length are added to the information data 55 in the first to third error correction modes. With this operation, the code data 50 including the information data 55 and the syndrome 53 has a fixed length of 16744 bits (2048 bytes+360 bits) regardless of the type of error correction mode. In the first preferred embodiment, the fixed length of the code data is set in accordance with the syndrome length in the third error correction mode with the highest correcting capability. In other words, in the third error correction mode, the code data 50 includes no dummy data.

Further, as shown in FIG. 3, respective threshold values are set for the first to third error correction modes. The threshold value for the first error correction mode is 10 bits. Specifically, when bit errors exceeding 10 bits are detected during the operation of the ECC circuit 34 in the first error correction mode, it is determined that it is necessary to change the first error correction mode to the second error correction mode. The threshold value for the second error correction mode is 14 bits. Specifically, when bit errors exceeding 14 bits are detected during the operation of the ECC circuit 34 in the second error correction mode, it is determined that it is necessary to change the second error correction mode to the third error correction mode. The correcting capability is thereby increased before errors exceeding the error correcting capability occur and the reliability of the data can be ensured. The threshold value for the third error correction mode is 22 bits. When bit errors exceeding 22 bits are detected during the operation of the ECC circuit 34 in the third error correction mode, the memory controller 3 has only to, for example, notify the host apparatus 1 that the number of bit errors exceeds the maximum error threshold value. The host apparatus 1 determines how to process the data after the maximum error occurs.

{6. Operation of Memory Controller 3}

Hereinafter, detailed discussion will be made on a read operation and an operation for changing the error correction mode, which are performed by the memory controller 3.

{6.1. Read Operation}

Figure 4:
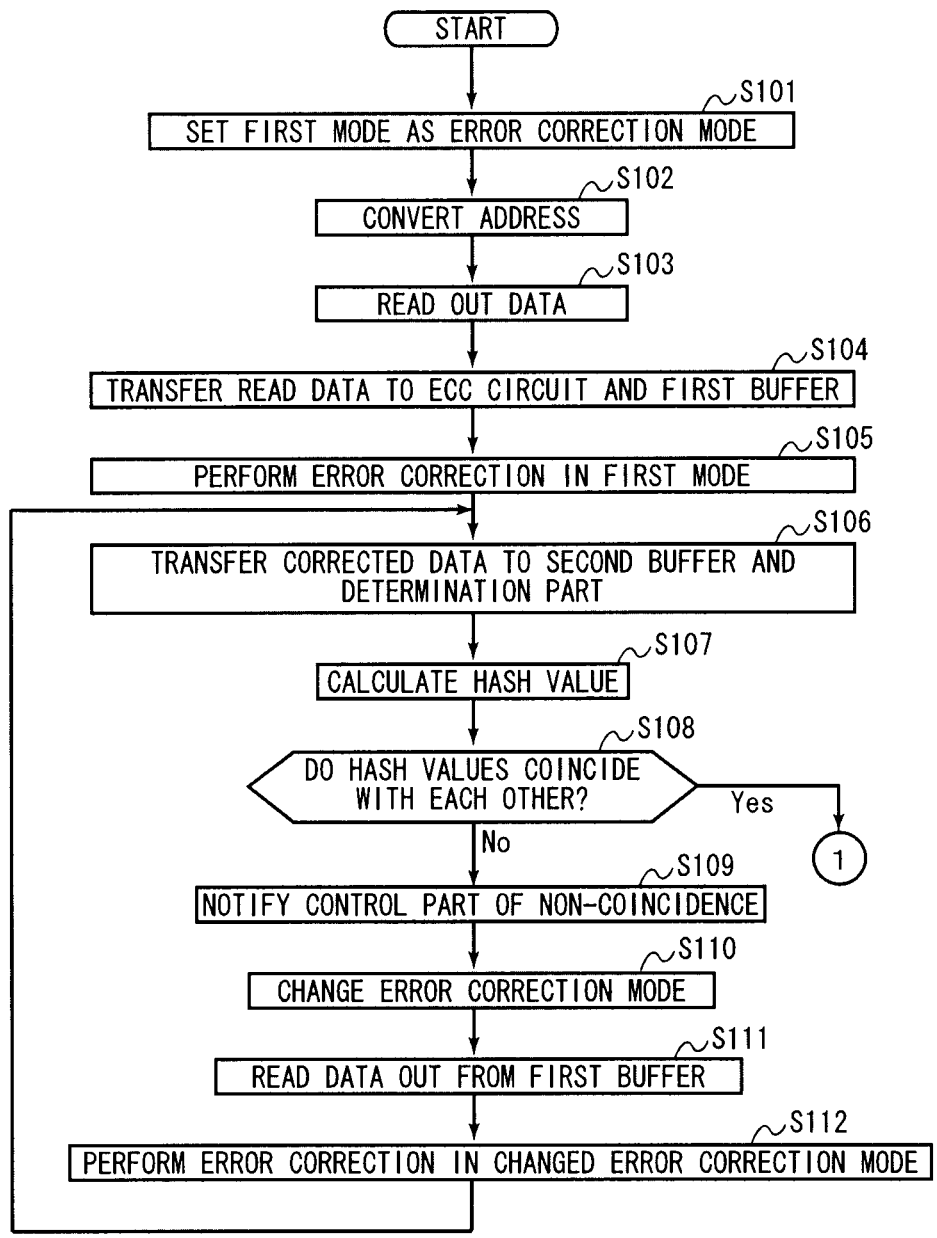
FIGS. 4 to 6 are flowcharts showing an operation of a memory controller 3.
Figure 5:
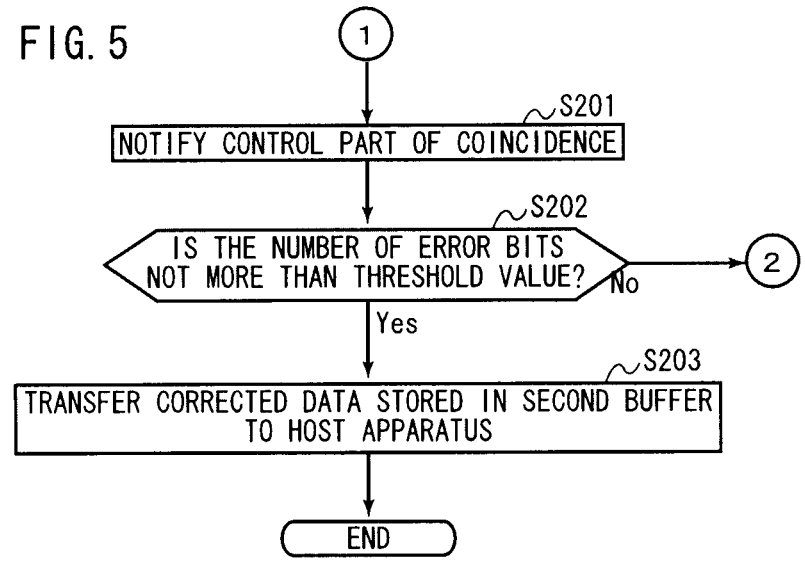
Figure 6:
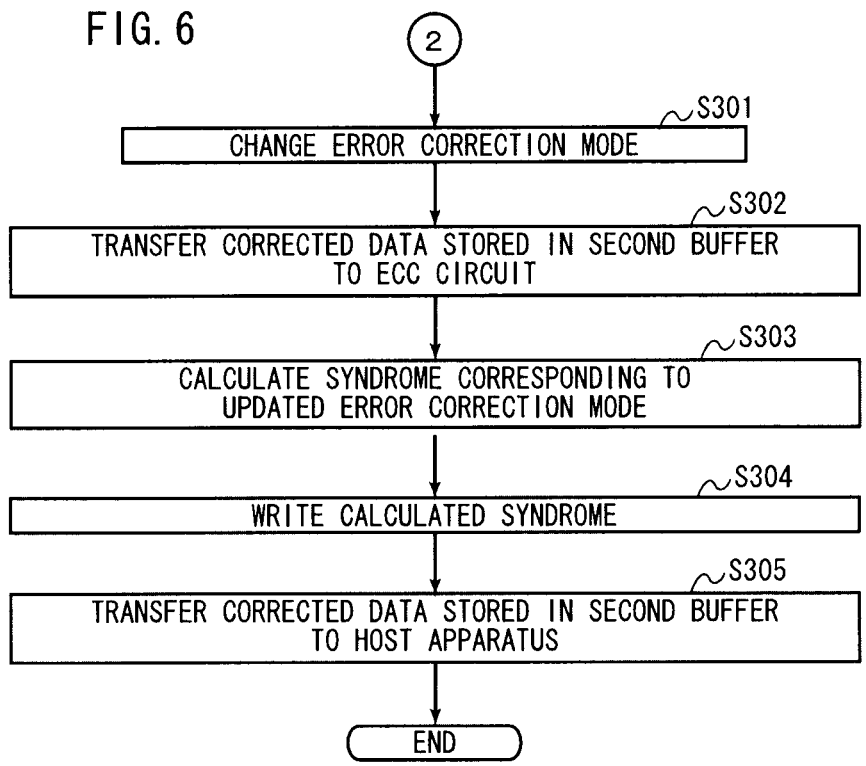

FIGS. 4 to 6 are flowcharts showing an operation of the memory controller 3 which performs a read operation. The memory controller 3 receives a request command for reading data stored in the memory 4, which is generated by the host apparatus 1. An operation shown in FIG. 4 thereby starts. The read command includes a logical address of a page to be read out.

After the control part 30 receives the read command through the host interface 31, the correction mode setting part 301 first sets the first error correction mode (Step S101). The correction mode setting part 301 notifies the ECC circuit 34 of a mode flag 91 indicating that the first error correction mode is set. The ECC circuit 34 thereby moves into a state for operation in the first error correction mode.

Subsequently, the memory controller 3 reads data stored in a page specified by the read command out from the memory 4. Specifically, the address conversion part 33 converts a logical address of the page specified by the read command into a physical address (Step S102). The memory interface 32 outputs the read command for the converted physical address to the memory 4. The data stored in the page specified by the read command is thereby read out from the memory 4 (Step S103).

The memory interface 32 outputs the read data to the ECC circuit 34 and the first buffer 35 (Step S104). The ECC circuit 34 performs an error detection process on the read data on the basis of the error correction mode set by the correction mode setting part 301. The ECC circuit 34 further performs correction of detected errors in the read data (Step S105). If the correction mode setting part 301 sets the first error correction mode, for example, the ECC circuit 34 performs an error correction process by using the syndrome (S10) of 180 bits included in the code data 50.

Figure 7:
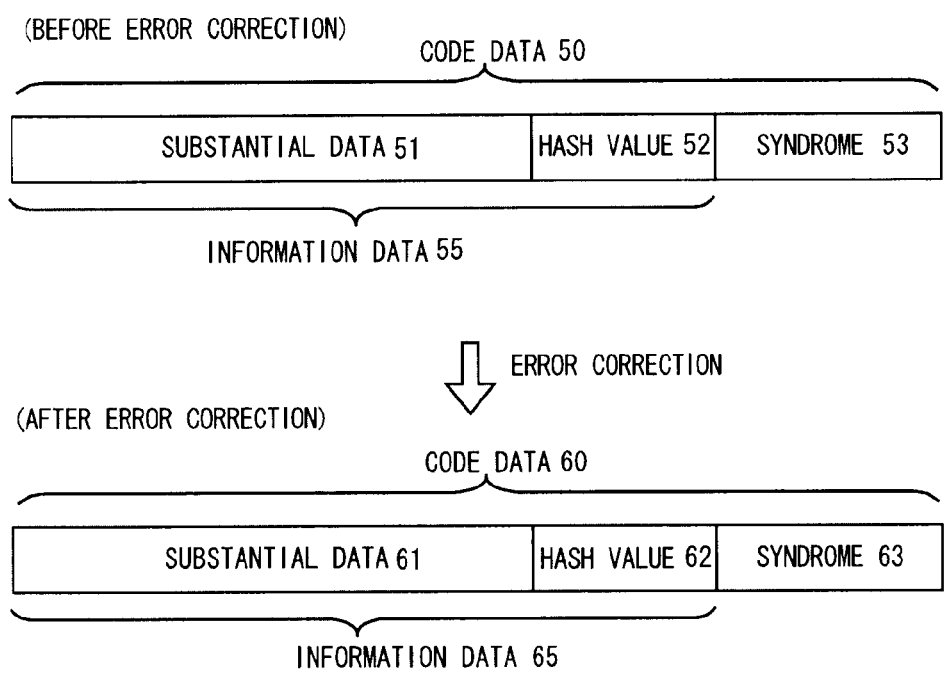
FIG. 7 is a view showing a structure of data stored in each page of the memory 4.

FIG. 7 is a view showing a format of the code data 50. The substantial data 51 is a substance of the data to be processed by the host apparatus 1. The hash value 52 is a hash value of the substantial data 51, which is an error detecting data added to the substantial data 51. The hash value 52 is calculated by the control part 30 from the substantial data 51 with no error before being written into the memory 4. Alternatively, the hash value 52 is stored in write data in advance. In other words, the information data 55 including the substantial data 51 and the hash value 52 may be given from the outside. The syndrome 53 is data to be used for detection and correction of bit errors as discussed with reference to FIG. 3. As discussed above, the syndrome 53 includes the dummy data as well as the substantial syndrome (S10 or the like). The data having the format shown in FIG. 7 is stored in each page of the memory 4.

Some bit errors in the code data 50 sometimes occur when the code data 50 is written into the memory 4. This type of errors is termed as a program disturb. Further, some bit errors in the code data 50 are also sometimes caused by repeatedly reading surrounding areas of the code data 50 in the memory 4. This type of errors is termed as a read disturb. The ECC circuit 34 performs detection and correction of the bit errors in the code data 50 by using the syndrome 53 included in the code data 50. The corrected code data 50 is outputted as code data 60 to the second buffer 36 and the determination part 37 (Step S106).

The determination part 37 analyzes the code data 60 to determine if the error correction process performed by the ECC circuit 34 is valid (Steps S107 and S108). Specifically, the determination part 37 calculates a hash value of substantial data 61 included in the code data 60 by using a hash function which is preset (Step S107). In FIG. 7, the hash value 62 included in the code data 60 is not data generated from the substantial data 61 but data generated by correcting errors of the hash value 52.

The determination part 37 checks whether or not the hash value 62 coincides with the hash value calculated from the substantial data 61 (Step S108), to thereby determine if the error correction process performed by the ECC circuit 34 is valid.

When the error correction mode applied to the ECC circuit 34 coincides with the error correction mode which is actually applied to the code data 50, the ECC circuit 34 can correct the bit errors in the code data 50. In this case, since the hash value 62 coincides with the hash value calculated from the substantial data 61 ("Yes" in Step S108), the determination part 37 determines that the substantial data 61 can be outputted to the host apparatus 1. The determination part 37 notifies the control part 30 of a validity flag 92 indicating that the error correction process performed by the ECC circuit 34 is valid (Step S201 of FIG. 5).

After the error correction process is performed on the code data 50, the ECC circuit 34 notifies the control part 30 of information 93 on the number of error bits in the code data 50. After receiving the information 93 on the number of error bits, the control part 30 compares the number of error bits in the code data 50 with the threshold value in the current error correction mode (Step S202). As shown in FIG. 3, the threshold value for the first error correction mode is 10 bits and the threshold value for the second error correction mode is 14 bits.

When the number of error bits in the code data 50 is less than the threshold value ("Yes" in Step S202), the output control part 303 acquires the substantial data 61 from the second buffer 36. The output control part 303 outputs the acquired substantial data 61 to the host apparatus 1 through the host interface 31 (Step S203).

Referring back to Step S108 of FIG. 4, when the error correction mode applied to the ECC circuit 34 does not coincide with the error correction mode which is actually applied to the code data 50, the ECC circuit 34 cannot correct the bit errors in the code data 50.

In this case, the hash value 62 does not coincides with the hash value calculated from the substantial data 61 ("No" in Step S108). The determination part 37 determines that the substantial data 61 cannot be outputted to the host apparatus 1 since it is not ensured that the errors in the substantial data 61 are corrected. The determination part 37 notifies the control part 30 of the validity flag 92 indicating that the error correction process performed by the ECC circuit 34 is invalid (Step S109).

When the validity flag 92 indicating that the error correction process is invalid is inputted to the control part 30, the correction mode setting part 301 changes the error correction mode (Step S110). The correction mode setting part 301 changes the current error correction mode to an error correction mode with a correcting capability higher than that of the current error correction mode. If the ECC circuit 34 operates in the first error correction mode, for example, the correction mode setting part 301 changes the error correction mode to the second error correction mode. If the ECC circuit 34 operates in the second error correction mode, the correction mode setting part 301 changes the error correction mode to the third error correction mode.

Herein, discussion will be made on an exemplary case where the first error correction mode is changed to the second error correction mode. The correction mode setting part 301 notifies the ECC circuit 34 of the mode flag 91 indicating that the second error correction mode is set. The ECC circuit 34 thereby moves into a state for operation in the second error correction mode.

Next, the ECC circuit 34 reads the code data 50 out from the first buffer 35 (Step S111). The code data 50 is data written into the first buffer 35 in Step S104. Alternatively, the memory controller 3 may read the code data 50 again from the memory 4 and output the code data 50 to the ECC circuit 34. In such a case, the first buffer 35 becomes unnecessary. The ECC circuit 34 detects errors in the code data 50 again on the basis of the error correction mode set by the correction mode setting part 301. The ECC circuit 34 further corrects the detected errors in the code data 50 (Step S112). In other words, the ECC circuit 34 performs the error correction process again in accordance with the changed error correction mode. If the second error correction mode is set by the correction mode setting part 301, for example, the ECC circuit 34 performs the error correction process by using the syndrome (S20) of 240 bits included in the code data 50.

After the error correction process is finished, the process goes back to Step S106 and the operations in Steps S106 to S108 are executed again. Then, when the hash value does not coincide with each other in Step S108, the operations in Steps S109 to S112 are executed again where an error correction mode with a higher correcting capability is set and the error correction process is performed in the changed error correction mode.

Thus, in the first preferred embodiment, the error correction process is first performed in accordance with the error correction mode with the lowest correcting capability, and then when the error correction process is determined to be invalid, the error correction mode is changed to an error correction mode with a higher correcting capability in a step-by-step manner and the error correction process is performed in the changed error correction mode. It is thereby possible to correct the respective data of all the pages with the different error correction mode applied to each code data 50, i.e., each page, without holding any information on the respective error correction mode to be applied to each page.

Referring back to Step S202 of FIG. 5, when the number of error bits in the code data 50 exceeds the threshold value ("No" in Step S202), the correction mode setting part 301 changes the error correction mode applied to the read code data 50 (Step S301). The correction mode setting part 301 changes the current error correction mode to an error correction mode with a correcting capability higher than that of the current error correction mode. The mode is changed so that the correcting capability of the error correction mode may increase in a step-by-step manner, for example, from the first error correction mode to the second error correction mode, or from the second error correction mode to the third error correction mode.

The change of the error correction mode in Step S110 discussed above is a change for searching for the correct error correction mode which is applied to the read data. On the other hand, the change of the error correction mode in Step S301 is an operation for changing the current error correction mode to another error correction mode to be applied to the read data since errors exceeding the threshold value are detected in the read data.

The correction mode setting part 301 notifies the ECC circuit 34 of the mode flag 91 indicating the changed error correction mode. The ECC circuit 34 thereby moves into a state for operation in the changed error correction mode.

The control part 30 reads the corrected information data 65 which is stored in second buffer 36. The control part 30 transfers the corrected information data 65 which is read out, to the ECC circuit 34 (Step S302). In other words, the control part 30 reads information data 65 including the substantial data 61 and the hash value 62 which are stored in the second buffer 36. The substantial data 61 and the hash value 62 stored in the second buffer 36 are data which are determined to be valid in Step S108.

The ECC circuit 34 calculates a syndrome with respect to the information data 65 including the substantial data 61 and the hash value 62 which are read out from the second buffer 36 in accordance with the changed error correction mode (Step S303). The ECC circuit 34 gives the code data 60 including the substantial data 61, the hash value 62, and the newly-calculated syndrome (syndrome of a fixed length with the dummy data added thereto as needed, as discussed above) to the memory interface 32. The control part 30 outputs a write command for the code data 60 to the address conversion part 33. The address conversion part 33 converts a logical address specified by the write command into a physical address and gives the physical address to the memory interface 32. The memory interface 32 outputs a write command for the given physical address to the memory 4. The code data 60 is thereby written into the page specified by the write command (Step S304). Herein, in the second error correction mode, the dummy data of 120 bits is added to the syndrome (S20) of 240 bits.

Finally, the output control part 303 acquires the substantial data 61 from the second buffer 36. The output control part 303 outputs the acquired substantial data 61 to the host apparatus 1 through the host interface 31 (Step S305).

Thus, in the first preferred embodiment, the ECC circuit 34 can operate in a plurality of error correction modes with different correcting capabilities. The respective data lengths of the syndromes (S10) to (S30) used in the different error correction modes are different from one another. In other words, as the correcting capability increases, the data lengths of the syndromes (S10) to (S30) become larger. In the first preferred embodiment, however, by adding the dummy data to the substantial syndrome, the syndrome of a fixed length including the syndrome and the dummy data is used. Therefore, even when the error correction mode is changed, the data length of the code data stored in the memory 4 is fixed and it is possible to prevent the management and operation of the memory 4 from becoming complicated.

The Second Preferred Embodiment

Figure 8:
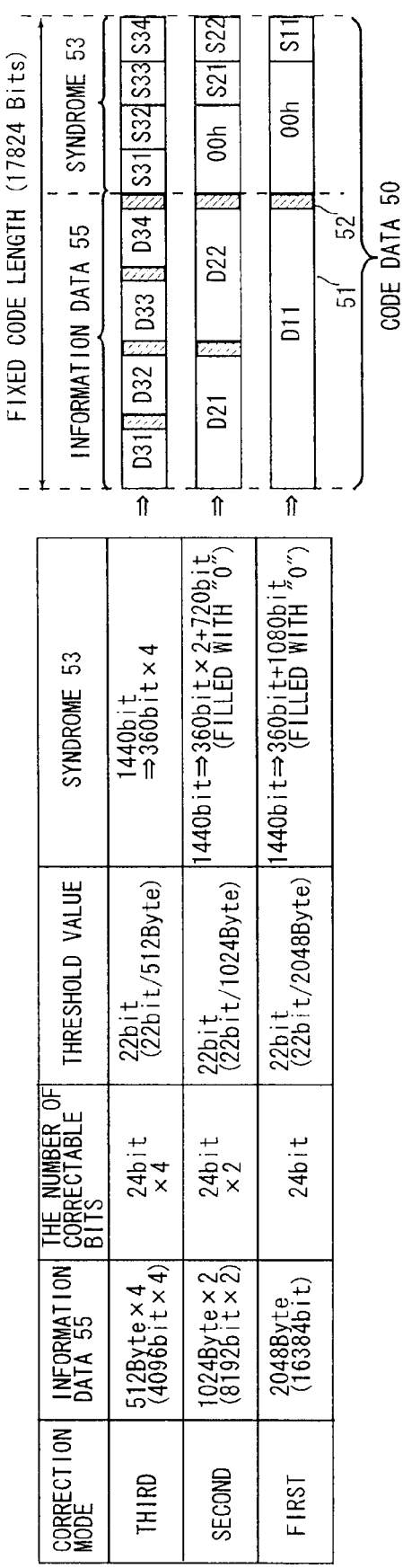
FIG. 8 is a view showing respective structures of code data 50 which are set in accordance with the error correction modes in accordance with a second preferred embodiment.

With reference to FIG. 8, the second preferred embodiment of the present invention will be discussed. The constitution of the information processing system 100 and the operation of the memory controller 3 in the second preferred embodiment are basically the same as those in the first preferred embodiment. The second preferred embodiment, however, is different from the first preferred embodiment only in the data structure of the code data 50. FIG. 8 is a view showing respective data structures of the code data 50 in the first to third error correction modes in accordance with the second preferred embodiment.

In the first error correction mode, it is possible to perform error correction of 24 bits on information data 55 of 2048 bytes. In the first error correction mode, a syndrome (S11) of 360 bits is used with respect to the information data 55 of 2048 bytes. By adding dummy data of 1080 bits of all "0" to the syndrome (S11) of 360 bits, however, a syndrome 53 of 1440 bits as a whole is stored into the memory 4.

In the lowest row of FIG. 8, shown is a data structure of the code data 50 in which the dummy data of 1080 bits filled with "0" and the syndrome (S11) of 360 bits are added to the information data (D11) of 2048 bytes. The information data (D11) includes the substantial data 51 and the hash value 52. In FIG. 8, the hash value 52 is hatched.

In the second error correction mode, it is possible to perform error correction of 24×2 bits on information data 55 of 2048 (=1024×2) bytes. In the second error correction mode, syndromes (S21) and (S22) each of 360 bits are used with respect to two pieces of information data (D21) and (D22) each of 1024 bytes. In other words, in the second error correction mode, it is possible to perform error correction of 24 bits on each of the two pieces of information data (D21) and (D22) of 1024 bytes. By adding dummy data of 720 bits of all "0" to the syndromes (S21) and (S22) of 720 (=360×2) bits, however, the syndrome 53 of 1440 bits as a whole is stored into the memory 4.

In the middle row of FIG. 8, shown is a data structure of the code data 50 in which the dummy data of 720 bits filled with "0" and the syndromes (S21) and (S22) each of 360 bits are added to the two pieces of information data (D21) and (D22) each of 1024 bytes. The two pieces of information data (D21) and (D22) each include the hash value 52.

In the third error correction mode, it is possible to perform error correction of 24×4 bits on information data 55 of 2048 (=512×4) bytes. In the third error correction mode, syndromes (S31), (S32), (S33), and (S34) each of 360 bits are used with respect to four pieces of information data (D31), (D32), (D33), and (D34) each of 512 bytes. In other words, in the third error correction mode, it is possible to perform error correction of 24 bits on each of the four pieces of information data (D31), (D32), (D33), and (D34) of 512 bytes.

In the uppermost row of FIG. 8, shown is a data structure of the code data 50 in which the syndromes (S31), (S32), (S33), and (S34) each of 360 bits are added to the four pieces of information data (D31), (D32), (D33), and (D34) each of 512 bytes.

Thus, in the first to third error correction modes, the bit lengths of the needed syndromes are different. In the second preferred embodiment, however, by adding the dummy data thereto, the syndromes 53 of a common fixed length are added to the information data 55 in the first to third error correction modes. With this operation, the code data 50 including the information data 55 and the syndrome 53 has a fixed length of 17824 bits (2048 bytes+1440 bits) regardless of the type of error correction mode.

Further, as shown in FIG. 8, respective threshold values are set for the first to third error correction modes. The threshold value for the first error correction mode is 22 bits. Specifically, when bit errors exceeding 22 bits are detected in the information data (D11) during the operation of the ECC circuit 34 in the first error correction mode, it is determined that it is necessary to change the first error correction mode to the second error correction mode. The threshold value for the second error correction mode is 22 bits. Specifically, when bit errors exceeding 22 bits are detected in the information data (D21) or (D22) during the operation of the ECC circuit 34 in the second error correction mode, it is determined that it is necessary to change the second error correction mode to the third error correction mode.

Thus, in the second preferred embodiment, the same threshold value is used in the first to third error correction modes. Since respective units of information data to which the syndromes are assigned are different from one another, however, the second error correction mode has an error correcting capability higher than that of the first error correction mode. Similarly, the third error correction mode has an error correcting capability higher than that of the second error correction mode.

The Third Preferred Embodiment

Figure 9:
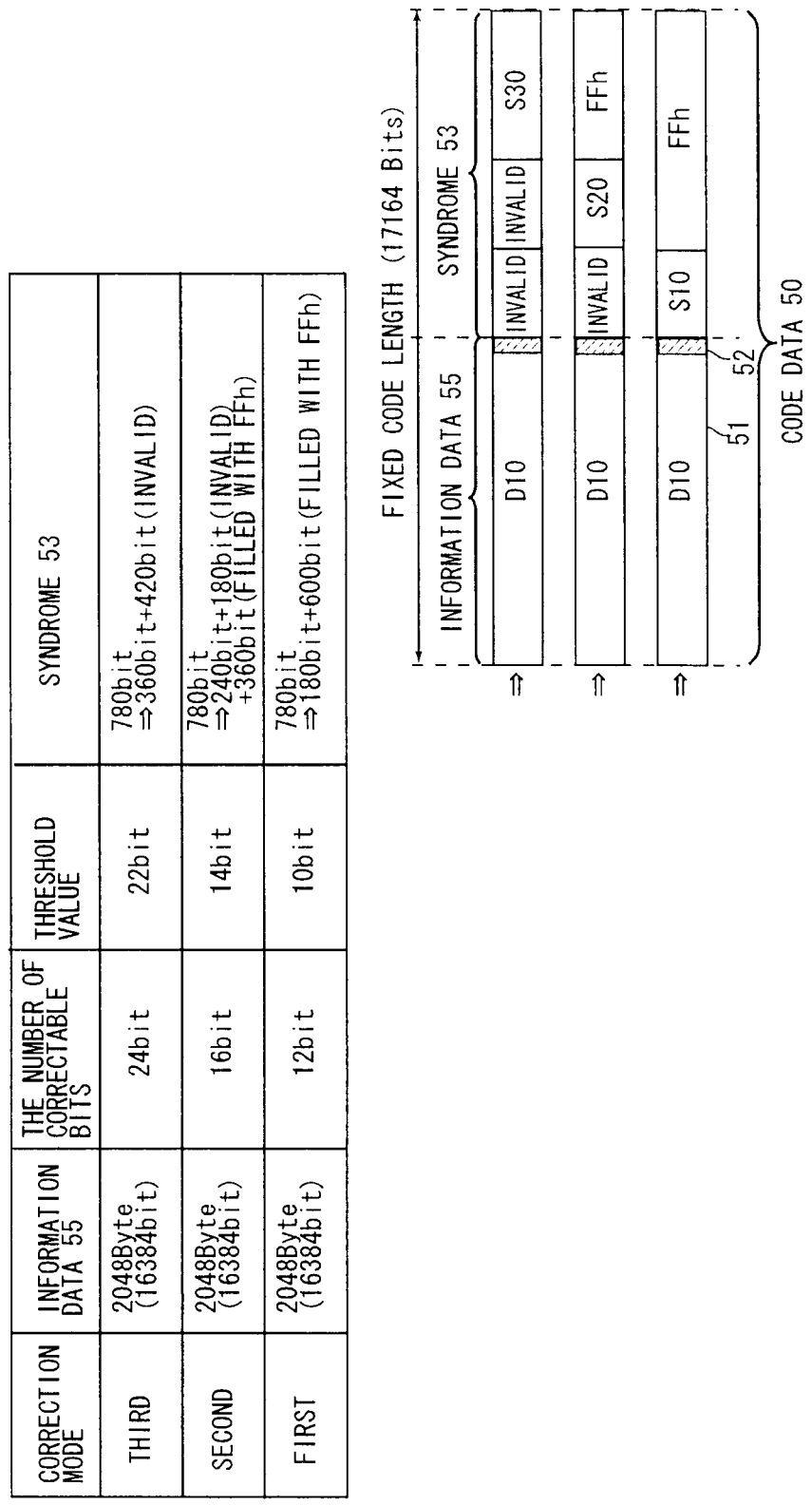
FIG. 9 is a view showing respective structures of code data 50 which are set in accordance with the error correction modes in accordance with a third preferred embodiment.

With reference to FIG. 9, the third preferred embodiment of the present invention will be discussed. The constitution of the information processing system 100 and the operation of the memory controller 3 in the third preferred embodiment are basically the same as those in the first and second preferred embodiments. The third preferred embodiment, however, is different from the first preferred embodiment only in the data structure of the code data 50. FIG. 9 is a view showing respective data structures of the code data 50 in the first to third error correction modes in accordance with the third preferred embodiment.

As can be seen from the comparison between FIGS. 9 and 3, the respective correcting capabilities, threshold values, and data sizes of the syndromes (S10) to (S30) in the first to third error correction modes in the third preferred embodiment are the same as those in the first preferred embodiment. The respective storage addresses of the syndromes (S10) to (S30) in the third preferred embodiment, however, are different from those in the first preferred embodiment.

As shown in FIG. 9, in the first error correction mode, the syndrome (S10) of 180 bits is stored. In the second error correction mode, the syndrome (S20) of 240 bits is stored. In the third error correction mode, the syndrome (S30) of 360 bits is stored. Further, the syndromes (S10), (S20), and (S30) are stored at different addresses.

In the first error correction mode, the syndrome (S10) is stored at a first address position in a storage area for the syndrome 53 of 780 bits. At the remaining addresses in the later position, stored is dummy data of all "1".

When the mode is changed from the first error correction mode to the second error correction mode, the memory controller 3 does not need to delete the syndrome (S10). The memory controller 3 stores the syndrome (S20) at an address position adjacent to the syndrome (S10). Then, at the remaining addresses in the later position from the syndrome (S20), stored is the dummy data of all "1". In the second error correction mode, though the syndrome (S10) remains stored therein, the syndrome (S10) is regarded as invalid data and not used.

When the mode is changed from the second error correction mode to the third error correction mode, the memory controller 3 does not need to delete the syndrome (S10) or (S20). The memory controller 3 stores the syndrome (S30) at an address position adjacent to the syndrome (S20). In the third error correction mode, though the syndromes (S10) and (S20) remain stored therein, both the syndromes (S10) and (S20) are regarded as invalid data and not used.

Thus, in the third preferred embodiment, when the error correction mode is changed, the syndromes (S20) and (S30) after the change can be additionally stored. In other words, since it is not necessary to delete the block including the syndrome(s) before the change, it is possible to increase the processing speed and reduce the power consumption.

The Fourth Preferred Embodiment

Figure 10:
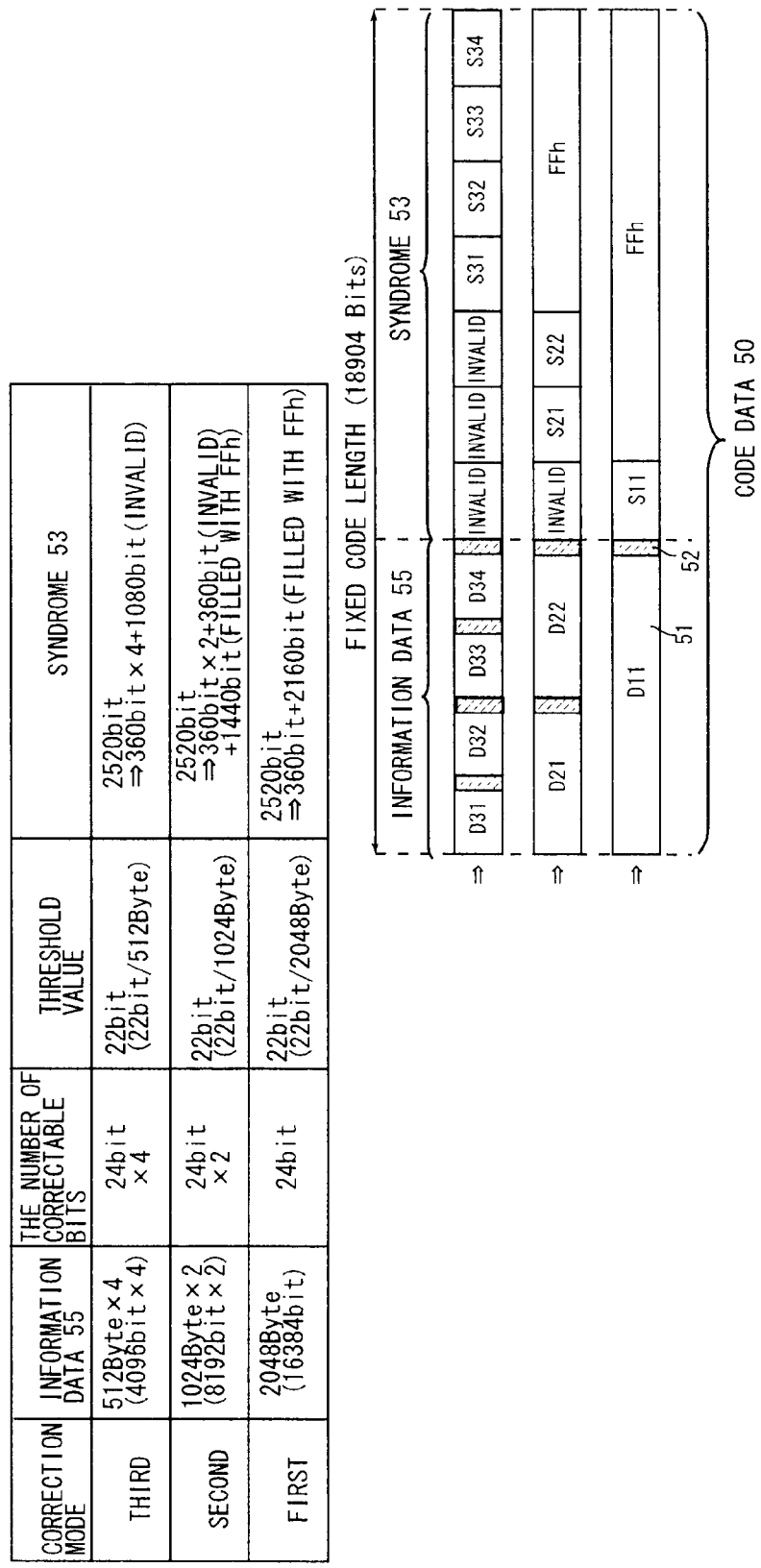
FIG. 10 is a view showing respective structures of code data 50 which are set in accordance with the error correction modes in accordance with a fourth preferred embodiment.

With reference to FIG. 10, the fourth preferred embodiment of the present invention will be discussed. The constitution of the information processing system 100 and the operation of the memory controller 3 in the fourth preferred embodiment are basically the same as those in the first to third preferred embodiments. The fourth preferred embodiment, however, is different from the first preferred embodiment only in the data structure of the code data 50. FIG. 10 is a view showing respective data structures of the code data 50 in the first to third error correction modes in accordance with the fourth preferred embodiment.

As can be seen from the comparison between FIGS. 10 and 8, the respective correcting capabilities, threshold values, and data sizes of the syndromes (S11), (S21), . . . in the first to third error correction modes in the fourth preferred embodiment are the same as those in the second preferred embodiment. The respective units of division of the pieces of information data 55 to which the syndromes (S11), (S21), . . . are added in the fourth preferred embodiment are the same as those in the second preferred embodiment. The respective storage addresses of the syndromes (S11), (S21), . . . in the fourth preferred embodiment, however, are different from those in the second preferred embodiment.

As shown in FIG. 10, in the first error correction mode, the syndrome (S11) of 360 bits is stored. In the second error correction mode, the syndromes (S21) and (S22) each of 360 bits are stored. In the third error correction mode, the syndromes (S31), (S32), (S33), and (S34) each of 360 bits are stored. Further, the syndromes (S11), (S21), (S22), (S31), (S32), (S33), and (S34) are stored at different addresses.

In the first error correction mode, the syndrome (S11) is stored at a first address position in a storage area for the syndrome 53 of 2520 bits. At the remaining addresses in the later position, stored is dummy data of all "1".

When the mode is changed from the first error correction mode to the second error correction mode, the memory controller 3 does not need to delete the syndrome (S11). The memory controller 3 stores the syndromes (S21) and (S22) at address positions adjacent to the syndrome (S11). Then, at the remaining addresses in the later position from the syndrome (S22), stored is the dummy data of all "1". In the second error correction mode, though the syndrome (S11) remains stored therein, the syndrome (S11) is regarded as invalid data and not used.

When the mode is changed from the second error correction mode to the third error correction mode, the memory controller 3 does not need to delete the syndrome (S11), (S21), or (S22). The memory controller 3 stores the syndromes (S31), (S32), (S33), and (S34) at address positions adjacent to the syndrome (S21). In the third error correction mode, though the syndromes (S11) (S21), and (S22) remain stored therein, all the syndromes (S11), (S21), and (S22) are regarded as invalid data and not used.

Thus, in the fourth preferred embodiment, when the error correction mode is changed, the syndromes after the change can be additionally stored. In other words, since it is not necessary to delete the block including the syndrome(s) before the change, it is possible to increase the processing speed and reduce the power consumption.

The Fifth Preferred Embodiment

Herein, the fifth preferred embodiment of the present invention will be discussed. In the first to fourth preferred embodiments, the memory controller 3 executes the error correction mode in order from the first mode to the third mode. Then, by checking if the error correction process is valid, the memory controller 3 can specify the error correction mode applied to each code data, in other words, each page.

Figure 11:
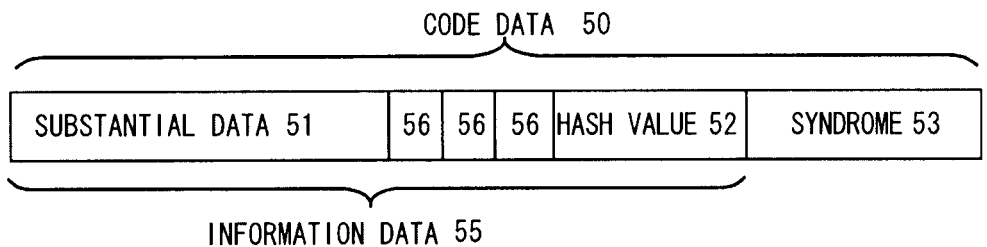
FIG. 11 is a view showing a data structure of code data 50 in accordance with a fifth preferred embodiment.

On the other hand, in the fifth preferred embodiment, as shown in FIG. 11, correction mode flags 56 are stored in the code data 50. The memory controller 3 can specify the error correction mode applied to each code data, in other words, each page by referring to the correction mode flag 56 included in the code data 50 which is read out.

If the correction mode flag 56 has an error itself, there is a possibility that the error correction mode may be wrongly determined. Then, in the fifth preferred embodiment, a plurality of (herein, three) correction mode flags 56 are duplicately stored in the code data 50. In other words, three correction mode flags 56 having the same value are duplicately stored. The memory controller 3 acquires the three correction mode flags 56 from the code data 50 which is read out. In other words, the correction mode flags 56 are acquired from the code data 50 before being corrected. The memory controller 3 determines one of the error correction modes indicated by the three correction mode flags 56 by majority rule. If the two correction mode flags 56 indicate the first error correction mode, for example, it can be determined that the first error correction mode should be applied, though the other one correction mode flag 56 indicates the second error correction mode.

The Sixth Preferred Embodiment

Herein, the sixth preferred embodiment of the present invention will be discussed. In the first to fourth preferred embodiments, the memory controller 3 executes the error correction mode in order from the first mode to the third mode. Then, by checking if the error correction process is valid, the memory controller 3 can specify the error correction mode applied to each code data, in other words, each page.

Figure 12:
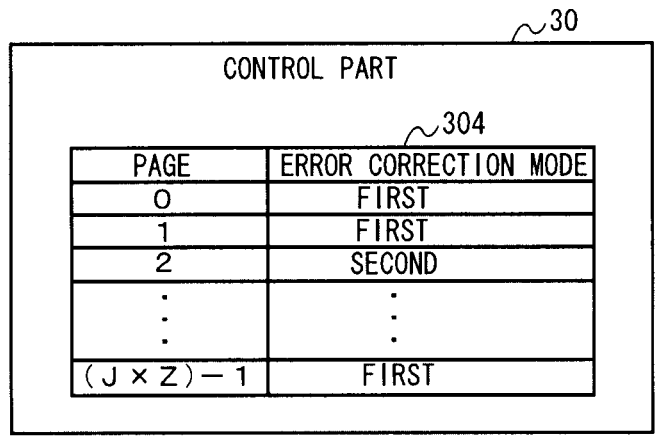
FIG. 12 is a view showing a map 304 stored in a control part in accordance with a sixth preferred embodiment.

On the other hand, in the sixth preferred embodiment, as shown in FIG. 12, the control part 30 holds a map 304 of the error correction mode which is applied to each page. When the error correction mode is changed, the control part 30 updates the map 304. The memory controller 3 can specify the error correction mode to be applied to each code data, in other words, each page by referring to the map 304.

The Seventh Preferred Embodiment

Herein, the seventh preferred embodiment of the present invention will be discussed. In the first to sixth preferred embodiments, the error correction mode is set for each code data stored in the memory 4, in other words, each page. In the seventh preferred embodiment, a common error correction mode is applied to all the pages.

Figure 13:
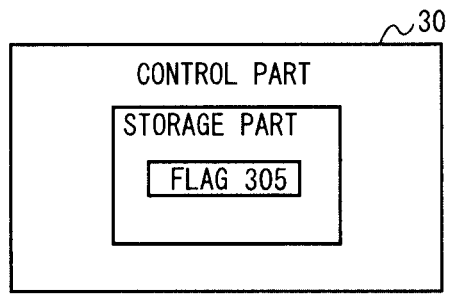
FIG. 13 is a view showing a flag 305 stored in the control part in accordance with a seventh preferred embodiment.

As shown in FIG. 13, the control part 30 holds a flag 305 indicating the common error correction mode applied to all the pages of the memory 4. When the error correction mode is changed, the control part 30 updates the flag 305. The memory controller 3 can specify the error correction mode to be applied to all pieces of code data which are currently stored, in other words, all the pages by referring to the flag 305.

While the invention has been shown and described in detail, the foregoing description is in all aspects illustrative and not restrictive. It is therefore understood that numerous modifications and variations can be devised without departing from the scope of the invention.

What is claimed is:

1. A memory controller for controlling access to a semiconductor memory, comprising:
   an error correction unit configured to perform an error correction process in a plurality of error correction modes with different correcting capabilities for data stored in said semiconductor memory;
   a control unit configured to set an error correction mode for application to information data when said information data is stored in said semiconductor memory; and
   an interface configured to read said information data from and write said information data into said semiconductor memory, wherein
   said error correction unit includes:
      a syndrome calculation unit configured to calculate a syndrome with respect to said information data in accordance with said error correction mode set by said control unit; and
      a code data generation unit configured to generate code data with a fixed code length which is set commonly to said plurality of error correction modes, the code data including said information data, said syndrome which is calculated, and dummy data added thereto as needed, said interface writes said code data into said semiconductor memory, and said error correction unit further includes a correction processing unit configured to perform a correction process on said code data by using said syndrome included in said code data when said interface reads out said code data, said control unit stores a plurality of pieces of correction mode information duplicately into said code data, each piece of correction mode information specifying an error correction mode applied to the code data, and said control unit identifies, from said plurality of pieces of correction mode information, a particular error correction mode for application to said code data, when said control unit reads out said code data.

2. The memory controller according to claim 1, wherein said error correction unit further includes a detection unit configured to detect the number of error bits included in said code data, said control unit includes a mode changing unit configured to compare said number of error bits detected by said detection unit with a threshold value of the number of error bits, which is preset for a current error correction mode, and change said current error correction mode to another error correction mode with a correcting capability higher than that of said current error correction mode when said number of error bits which is detected exceeds said threshold value, said syndrome calculation unit recalculates a syndrome with respect to said information data in accordance with said error correction mode after being changed, and said interface stores said syndrome after being changed into said semiconductor memory.

3. The memory controller according to claim 2, wherein said code data generation unit generates code data with said fixed code length again, the code data including said information data, said syndrome which is recalculated, and said dummy data added thereto as needed, and said interface rewrites said code data stored in said semiconductor memory with said code data which is calculated again.

4. The memory controller according to claim 2, wherein said interface stores said syndrome which is recalculated at an address different from that of said syndrome which is already stored, in the same page.

5. The memory controller according to claim 1, wherein said control unit first sets an error correction mode with the lowest correcting capability when a read request is issued for data stored in said semiconductor memory, and said error correction unit performs an error correction process on read data in accordance with said error correction mode with the lowest correcting capability which is set by said control unit.

6. The memory controller according to claim 5, wherein said control unit determines whether said error correction process is valid after said error correction process is performed in accordance with said error correction mode which is currently set, and changes said error correction mode to an error correction mode with a correcting capability which is higher than that of said error correction mode which is currently set when said error correction process is determined as invalid, and said error correction unit performs an error correction process again on said read data in accordance with said error correction mode after being changed by said control unit.

7. The memory controller according to claim 6, wherein said error correction unit operates in error correction modes of three levels or more and sequentially changes said error correction mode to an error correction mode with a correcting capability higher than that of said error correction mode which is currently set until the error correction process is determined as valid.

8. The memory controller according to claim 6, wherein said control unit includes a generation unit configured to generate error detecting data from data stored in said semiconductor memory, said syndrome calculation unit calculates a syndrome with respect to information data in which said error detecting data is added to said data stored in said semiconductor memory, and said control unit determines whether said error correction process performed by said error correction unit is valid by checking for any error in said information data by using said error detecting data after said error correction process is performed by said error correction unit.

9. The memory controller according to claim 1, wherein said control unit holds information which records therein an error correction mode which is currently applied to each page.

10. The memory controller according to claim 1, wherein said control unit holds information which records therein an error correction mode which is currently applied to all pages and causes said error correction unit to be adapted to said error correction mode common to all said pages of said semiconductor memory.

11. The memory controller according to claim 1, wherein said fixed code length is a code length in a case where a syndrome length in an error correction mode with the highest correcting capability is added to said information data.

* * * * *